(12) United States Patent
Lee et al.

(10) Patent No.: US 10,088,606 B2
(45) Date of Patent: Oct. 2, 2018

(54) PROTECTIVE FILM FOR A POLARIZER, A POLARIZING PLATE COMPRISING THE SAME, AND A DISPLAY DEVICE WITH THE POLARIZING PLATE

(71) Applicant: SKC CO., LTD., Gyeonggi-do (KR)

(72) Inventors: Se Chul Lee, Gyeonggi-do (KR); Young Min Heo, Gyeonggi-do (KR); Da Woo Jeong, Gyeonggi-do (KR); Ho Chun Kang, Seoul (KR); Jang Won Lee, Gyeonggi-do (KR)

(73) Assignee: SKC CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/626,240

(22) Filed: Jun. 19, 2017

(65) Prior Publication Data
US 2017/0363778 A1    Dec. 21, 2017

(30) Foreign Application Priority Data

Jun. 20, 2016 (KR) ........................ 10-2016-0076717

(51) Int. Cl.
| | |
|---|---|
| *G02B 1/00* | (2006.01) |
| *G02B 1/14* | (2015.01) |
| *G02B 1/04* | (2006.01) |
| *G02B 5/30* | (2006.01) |
| *G02F 1/1335* | (2006.01) |
| *H01L 51/52* | (2006.01) |

(52) U.S. Cl.
CPC .............. *G02B 1/14* (2015.01); *G02B 1/04* (2013.01); *G02B 5/3025* (2013.01); *G02F 1/133502* (2013.01); *G02F 1/133528* (2013.01); *G02F 2201/501* (2013.01); *H01L 51/5281* (2013.01)

(58) Field of Classification Search
CPC ... G02B 5/30; G02B 1/04; G02B 1/14; G02B 5/3025; G02F 1/1335; G02F 1/133528; G02F 1/133502; G02F 2201/501; H01L 51/5281
USPC ......................................................... 359/507
See application file for complete search history.

(56) References Cited

U.S. PATENT DOCUMENTS

| | | |
|---|---|---|
| 2006/0226561 A1 | 10/2006 | Merrill et al. |
| 2009/0169772 A1 | 7/2009 | Yamada et al. |
| 2009/0326190 A1 | 12/2009 | Merrill et al. |
| 2013/0123459 A1 | 5/2013 | Merrill et al. |
| 2014/0168767 A1 | 6/2014 | Shin |
| 2014/0293197 A1 | 10/2014 | Shin |

(Continued)

FOREIGN PATENT DOCUMENTS

| | | |
|---|---|---|
| CN | 104076429 A | 10/2014 |
| CN | 105378519 A | 3/2016 |

(Continued)

OTHER PUBLICATIONS

Japanese Office Action dated Nov. 1, 2017 for JP Patent Application No. 2017-120397 with machine translation (counterpart to Korean Patent Application No. 10-2016-0076717).

(Continued)

*Primary Examiner* — Euncha Cherry
(74) *Attorney, Agent, or Firm* — Paul D. Bianco; Fleit Gibbons Gutman Bongini & Bianco PL

(57) ABSTRACT

Disclosed are a protective film for a polarizer with superior optical and mechanical properties, a polarizing plate including the same and a display device including the same.

16 Claims, 4 Drawing Sheets

(56) References Cited

U.S. PATENT DOCUMENTS

| | | | |
|---|---|---|---|
| 2015/0210023 A1 | 7/2015 | Merrill et al. | |
| 2016/0195660 A1 | 7/2016 | Nakao | |
| 2016/0209568 A1* | 7/2016 | Shin | G02F 1/133528 |
| 2017/0363779 A1 | 12/2017 | Lee | |

FOREIGN PATENT DOCUMENTS

| | | |
|---|---|---|
| JP | H10-234821 | 9/1998 |
| JP | 2008-537795 A | 9/2008 |
| JP | 201-118509 | 5/2010 |
| JP | 2011-112928 A | 6/2011 |
| JP | 4962661 | 6/2012 |
| JP | 4962661 B2 | 6/2012 |
| JP | 2015-072376 | 4/2015 |
| JP | 2016-071343 | 5/2016 |
| KR | 10-2012-0070618 | 6/2012 |
| KR | 10-2014-0042714 | 4/2014 |
| KR | 10-2014-0140770 | 12/2014 |
| KR | 10-2015-0114860 | 10/2015 |
| KR | 10-2015-0127455 | 11/2015 |
| KR | 10-2016-0063539 | 6/2016 |
| KR | 10 2016 0063539 A | 6/2016 |
| TW | I530717 B | 4/2016 |
| TW | 201601921 B | 11/2016 |
| WO | 2007/066514 | 6/2007 |
| WO | 2011/162198 | 12/2011 |
| WO | 2013/133064 A1 | 2/2013 |
| WO | 2015/170872 A1 | 11/2015 |

OTHER PUBLICATIONS

Korean First Office Action dated Aug. 22, 2016, Application No. 119981093980, 11 pages.
Korean Notice of Allowance dated Dec. 29, 2016 for Application No. 119981093980, 4 pages.
Office Action dated May 31, 2018 issued by the Chinese Patent Office for CN 201710491697.0.
Japanese Office Action dated Nov. 1, 2017 for JP Patent Application No. 2017-120398, with machine translation (counterpart to Korean Patent Application No. 10-2016-0076724).
Office Action dated Mar. 23, 2018 for U.S. Appl. No. 15/626,246 (22 pages).
Response (dated May 14, 2018) to Office Action for U.S. Appl. No. 15/626,246.
Final Rejection from Japanese Intellectual Property Office for JP2017-120398, dated Apr. 23, 2018 (with partial English translation).
Letter dated Mar. 19, 2018, relating to Office Action dated Feb. 21, 2018 for Taiwan Patent Application No. 106120378 4 pages.
Taiwan Office Action dated Feb. 21, 2018 for Taiwan Patent Application No. 106120378, 3 pages.

\* cited by examiner

PROTECTIVE FILM FOR A POLARIZER, A POLARIZING PLATE COMPRISING THE SAME, AND A DISPLAY DEVICE WITH THE POLARIZING PLATE

CROSS-REFERENCE TO RELATED APPLICATIONS

This application claims, under 35 U.S.C. § 119, the priority of Korean Patent Application No. 10-2016-0076717, filed on Jun. 20, 2016, in the Korean Intellectual Property Office, the entire contents of which are incorporated herein by reference.

BACKGROUND (a) Technical Field

The present invention relates to a protective film for a polarizer with superior optical and mechanical properties, a polarizing plate including the same and a display device including the same.

(b) Background Art

Recently, interests in a polarizing plate, an essential component of a liquid crystal display (LCD), are increasing as the demand on the liquid crystal display increases rapidly.

The polarizing plate, which polarizes incident natural light oscillating in various directions into light oscillating in one direction only, is an essential component for providing transmitted light and changing the color tone of the transmitted light.

The polarizing plate has a structure in which a protective film is stacked on one or both sides of a polarizer. As the polarizer, polyvinyl alcohol (PVA) is commonly used. In the past, triacetyl cellulose (TAC) was commonly used as the protective film.

Meanwhile, as the functions and applications of the liquid crystal display (LCD) become more diversified, normal operation under harsh conditions is required. However, triacetyl cellulose (TAC) does not satisfy this requirement because it is vulnerable to moisture and has weak durability.

Recently, there have been many attempts to replace the triacetyl cellulose (TAC) with polyethylene terephthalate (PET) as in Japanese Patent Application No. 2011-532061 and Japanese Patent Publication No. 2010-118509. It is because polyethylene terephthalate (PET) can satisfy the above requirement because it has superior mechanical property, chemical resistance and moisture barrier property.

However, because polyethylene terephthalate (PET) is highly birefringent, it leads to distorted polarization between the polarizer and the liquid crystal and, accordingly, significantly reduces visibility. A typical example is the rainbow stains appearing on the surface of the protective film.

Because the rainbow stains become easily visible due to the recent trend of high brightness and high color purity of the liquid crystal display (LCD), the rainbow stains are a big obstacle to use of the polyethylene terephthalate (PET) for the protective film.

REFERENCES OF THE RELATED ART

Patent Documents (Patent document 1) Japanese Patent Application No. 2011-532061.

(Patent document 2) Japanese Patent Publication No. 2010-118509.

SUMMARY

The present invention has been made to resolve the above-described problems and limitations.

The present invention is directed to providing a protective film for a polarizer free from rainbow stains, a polarizing plate including the same and a display device including the same.

The present invention is also directed to providing a protective film which has good mechanical property such as degree of crystallization, tensile strength, pencil hardness, etc. without impairing visibility due to superior optical property, a polarizer including the same and a display device including the same.

The purposes of the present invention are not limited to those mentioned above. The purposes of the present invention will become more apparent by the following description and will be realized by the means described in the claims and their combinations.

A protective film for a polarizer according to an exemplary embodiment may contain polyethylene terephthalate (PET) and satisfy the conditions of (1) and (2).

(1) In-plane phase difference $(R_o) \leq 350$ nm (2) Phase difference in thickness direction $(R_{th}) \geq 6{,}000$ nm The protective film for a polarizer according to an exemplary embodiment may have an in-plane phase difference $(R_o)$ at the width center of 200 nm or less.

The protective film for a polarizer according to an exemplary embodiment may have an in-plane phase difference $(R_o)$ within ±500 mm from the width center along the width direction of 250 nm or less.

The protective film for a polarizer according to an exemplary embodiment may have an in-plane phase difference $(R_o)$ within ±1000 mm from the width center along the width direction of 300 nm or less.

The protective film for a polarizer according to an exemplary embodiment may have a ratio $(R_{th}/R_o)$ of the phase difference in the thickness direction $(R_{th})$ with respect to the in-plane phase difference $(R_o)$ at the width center of 60 or larger and 1,600 or smaller.

The protective film for a polarizer according to an exemplary embodiment may have a variation in the in-plane phase difference $(R_{o,max} - R_{o,min})$ within the effective width of 250 nm/m or less.

The protective film for a polarizer according to an exemplary embodiment may experience change in the in-plane phase difference with respect to the width change within the effective width $(|\Delta R_o|/|\Delta x|)$ of less than 5 nm/cm.

The protective film for a polarizer according to an exemplary embodiment may have a stretching ratio in the length direction (MD) of 2.8-3.5 times and a stretching ratio in the width direction (TD) of 2.9-3.7 times.

The protective film for a polarizer according to an exemplary embodiment may have a ratio (MD/TD) of a stretching ratio in the length direction (MD) with respect to a stretching ratio in the width direction (TD) of 0.9-1.1.

The protective film for a polarizer according to an exemplary embodiment may have a thickness of 20-60 µm.

The protective film for a polarizer according to an exemplary embodiment may be heat-treated at 160-230° C.

A polarizing plate according to an exemplary embodiment may include a polarizer and the protective film for a polarizer described above which is adjacent to at least one of the upper side and the lower side of the polarizer.

A display device according to an exemplary embodiment may include a display panel and the polarizing plate described above which is disposed on at least one of the upper side and the lower side of the display panel.

The present invention provides the following advantageous effects.

The protective film for a polarizer according to an exemplary embodiment and the polarizing plate including the same do not impair visibility because they are free from rainbow stains and have good durability due to superior mechanical property such as tensile strength, pencil hardness, etc.

Accordingly, the display device equipped with the polarizing plate according to an exemplary embodiment can be used in various applications because it has superior optical property and can be operated normally even under harsh environment.

The effects of the present invention are not limited to those described above. It is to be understood that the effects of the present invention include all the effects that can be inferred from the following description.

BRIEF DESCRIPTION OF DRAWINGS

FIGS. 5A, 5B and 5C show results for the entire effective width, the range from 0 mm (width center) to −1,500 mm, and the range from 0 mm (width center) to +1,500 mm, respectively.

FIGS. 6A, 6B and 6C show results for the entire effective width, the range from 0 mm (width center) to −1,500 mm, and the range from 0 mm (width center) to +1,500 mm, respectively.

DETAILED DESCRIPTION OF MAIN ELEMENTS

10: polarizing plate 11: polarizer 12: protective film for polarizer

DETAILED DESCRIPTION

Hereinafter, the present invention is described in detail by exemplary embodiments. The exemplary examples can be modified in various forms within the scope of the present invention and scope of the present invention is not limited by the exemplary embodiments.

In the exemplary embodiments described below, a film, membrane, panel, layer, etc. formed "on" or "under" a film, membrane, panel, layer, etc. may be formed either "directly" or "indirectly with another component disposed therebetween".

In the attached drawings, the components may be magnified in size for the purpose of illustration.

Figure 1:
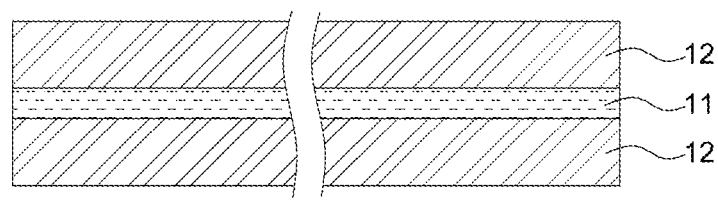
FIG. 1 schematically shows a polarizing plate according to an exemplary embodiment.

FIG. 1 schematically shows a polarizing plate 10 according to an exemplary embodiment.

The polarizing plate 10 according to an exemplary embodiment includes a polarizer 11 and a protective film 12 for a polarizer (hereinafter, 'protective film') which is adjacent to at least one of the upper side and the lower side of the polarizer 11.

The polarizer 11 polarizes natural light incident on the polarizing plate while oscillating in various directions into light oscillating in one direction only.

The polarizer may be polyvinyl alcohol (PVA) doped with iodine, etc. Polyvinyl alcohol (PVA) molecules contained in the polarizer may be arranged along one direction.

Specifically, the protective film 12 may be formed from a material having superior mechanical property. Accordingly, the protective film may be formed from a material having polyester as a main component. By crystallizing the polyester by performing heating, stretching, etc., degree of crystallization can be increased and, through this, mechanical property such as tensile strength, etc. may be enhanced.

In addition, the polyester may improve the durability of the polarizing plate under humid environment because it has lower water vapor permeability than triacetyl cellulose (TAC).

As the polyester, a homopolymer obtained from polycondensation of a dicarboxylic acid such as terephthalic acid, isophthalic acid, ortho-phthalic acid, 2,5-naphthalenedicarboxylic acid, 2,6-naphthalenedicarboxylic acid, 1,4-naphthalenedicarboxylic acid, 1,5-naphthalenedicarboxylic acid, diphenylcarboxylic acid, diphenoxyethanedicarboxylic acid, diphenylsulfonecarboxylic acid, anthracenedicarboxylic acid, 1,3-cyclopentanedicarboxylic acid, 1,3-cyclohexanedicarboxylic acid, 1,4-cyclohexanedicarboxylic acid, hexahydroterephthalic acid, hexahydroisophthalic acid, malonic acid, dimethylmalonic acid, succinic acid, 3,3-diethylsuccinic acid, glutaric acid, 2,2-dimethylglutaric acid, adipic acid, 2-methyladipic acid, trimethyladipic acid, pimelic acid, azelaic acid, dimer acid, sebacic acid, suberic acid, dodecanedicarboxylic acid, etc. or a diol such as ethylene glycol, propylene glycol, hexamethylene glycol, neopentyl glycol, 1,2-cyclohexanedimethanol, 1,4-cyclohexanedimethanol, decamethylene glycol, 1,3-propanediol, 1,4-butanediol, 1,5-oebtabediol, 1,6-hexanediol, 2,2-bis(4-hydroxyphenyl)propane, bis(4-hydroxyphenyl)sulfone, etc., a copolymer obtained from polycondensation of one or more dicarboxylic acid and two or more diols, a copolymer obtained from polycondensation of two or more dicarboxylic acids and one or more diol or a blend resin obtained from blending of two or more of the homopolymer or the copolymer may be used.

Specifically, an aromatic polyester may be used considering the degree of crystallization of the polyester. Most specifically, polyethylene terephthalate (hereinafter, 'PET') may be used.

However, PET may not be suitable for use as the protective film because it lacks crystallinity in an unstretched state. Accordingly, biaxially stretched PET may be used as the protective film.

The PET may be biaxially stretched along a width direction (transverse direction, TD) and a length direction (machine direction, MD) through simultaneous biaxial stretching or sequential biaxial stretching. Specifically, the PET may be biaxially stretched sequentially by stretching along one direction and then stretching along a direction perpendicular thereto, although not being limited thereto.

Although the PET has superior mechanical property and moisture barrier property, it may distort polarization when used in the protective film as it is due to very high birefringence. A typical example is the rainbow stains described above.

Accordingly, in the present invention, the optical property of the PET is improved to prevent the rainbow stains so that it is suitable to be used for the protective film. A detailed description is given below.

The protective film satisfies the conditions of (1) and (2).
(1) In-plane phase difference ($R_o$)≤350 nm
(2) Phase difference in thickness direction ($R_{th}$)≥6,000 nm The in-plane phase difference ($R_o$) is a parameter defined as the anisotropy of refractive indices ($\Delta N_{xy}=|N_x-N_y|$) in two perpendicular axes on the protective film (see FIG. 2) times the thickness d of the protective film, i.e., $\Delta N_{xy} \times d$, and is a measure of optical isotropy and anisotropy.

The phase difference in the thickness direction ($R_{th}$) is a parameter representing the mean of phase difference which is obtained by two birefringences $\Delta N_{xz}(=|N_x-N_z|)$ and $\Delta N_{yz}(=|N_y-N_z|)$ seen from the cross section of the protective film times the thickness d of the protective film.

Specifically, the in-plane phase difference ($R_o$) of the protective film may be 350 nm or less. If the in-plane phase difference ($R_o$) increases, the occurrence of rainbow stains becomes severe. Therefore, the smaller the in-plane phase difference, the better. However, because stretching ratio or thickness has to be decreased to reduce the in-plane phase difference of PET, mechanical property may worsen. Accordingly, for balanced optical property and mechanical property, the lower limit of the in-plane phase difference ($R_o$) may be 10 nm or more, specifically 30 nm or more, more specifically 50 nm or more.

As described above, it is easier to prevent the occurrence of rainbow stains as the in-plane phase difference ($R_o$) is smaller. Accordingly, the in-plane phase difference ($R_o$) at the width center of the protective film may be 200 nm or less.

Figure 2:
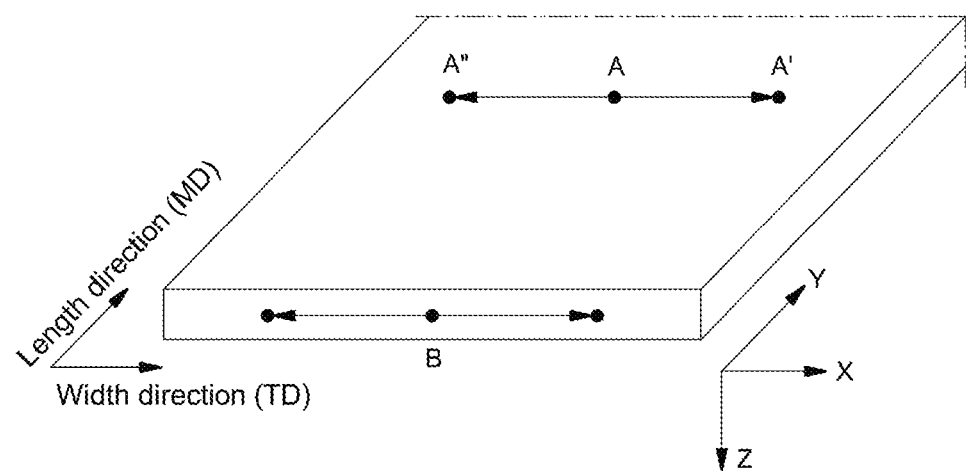
FIG. 2 is a diagram for describing a protective film for a polarizer according to an exemplary embodiment.

In the present disclosure, the 'width center' is defined as the midpoint (A, B) of the width the protective film after being stretched in the width direction (TD) and the length direction (MD), as shown in FIG. 2. The width center is not present singularly in the protective film but may be present in numerous numbers depending on the measurement site.

And, the 'effective width' which will be described below refers to the length in the width direction required for the protective film to be applicable for a polarizing plate for large-screen applications. Specifically, it refers to the distance between the positions (A', A'') that have been moved from the width center (A) along the x-axis toward both ends, as shown in FIG. 2. In an exemplary embodiment, it is defined as ±1,500 mm from the width center, i.e., about 3,000 mm.

The protective film may have a variation in the in-plane phase difference ($R_{o,max}-R_{o,min}$) within the effective width of 250 nm/m or less, more specifically 167 nm/m or less. The variation in the in-plane phase difference is the difference between the maximum ($R_{o,max}$) and the minimum ($R_{o,min}$) of the in-plane phase difference per meter (m) within the effective width. If the variation in the in-plane phase difference is small, the occurrence of rainbow stains can be prevented effectively because the in-plane phase difference ($R_o$) does not increase significantly even when the width of the protective film is large.

The protective film may experience change in the in-plane phase difference with respect to the width change within the effective width ($|\Delta R_o|/|\Delta x|$) of less than 5 nm/cm, more specifically less than 3 nm/cm. The width change refers to the distance between given points along the x-axis ($\Delta x = x_2 - x_1$) and the change in the in-plane phase difference refers to the change in the in-plane phase difference at the given points ($\Delta R_o = R_{o,2} - R_{o,1}$). More specifically, the mean of the change in the in-plane phase difference within the effective width of the protective film may be less than 5 nm/cm, more specifically less than 3 nm/cm. The mean of the change in the in-plane phase difference may be measured for a distance of about 1-30 cm. By controlling such that the change in the in-plane phase difference with respect to the width change is small, the in-plane phase difference ($R_o$) may be prevented from increasing significantly within the effective width.

Accordingly, it is desired that the protective film has the in-plane phase difference ($R_o$) at the width center of 200 nm or less, the in-plane phase difference ($R_o$) within ±500 mm from the width center along the width direction of 250 nm or less and the in-plane phase difference ($R_o$) within ±1000 mm from the width center along the width direction of 300 nm or less while satisfying the condition (1).

Specifically, the protective film may have a phase difference in the thickness direction ($R_{th}$) of 6,000 nm or more. If the phase difference in the thickness direction ($R_{th}$) is large, crystallization is accelerated because the degree of molecular orientation in the protective film is large. Therefore, it is desired that the phase difference in the thickness direction ($R_{th}$) is large in the aspect of mechanical property. In addition, as the phase difference in the thickness direction ($R_{th}$) is larger, the ratio ($R_{th}/R_o$) of the phase difference in the thickness direction ($R_{th}$) with respect to the in-plane phase difference ($R_o$) at the width center to be described below becomes larger. Accordingly, the rainbow stains can be prevented effectively. But, for PET, the thickness has to be increased to increase phase difference in the thickness direction ($R_{th}$), which is disadvantageous in terms of cost and film thickness. Accordingly, the upper limit of the phase difference in the thickness direction ($R_{th}$) may be set to 16,000 nm or less, specifically 15,000 nm or less, more specifically 14,000 nm or less.

As described above, as the phase difference in the thickness direction ($R_{th}$) is larger, it is easier to prevent the occurrence of rainbow stains and improve mechanical property. Accordingly, the protective film may have the phase difference in the thickness direction ($R_{th}$) at the width center of 6,800 nm or more.

And, for the same reason as the in-plane phase difference ($R_o$), it is desired that the protective film has the phase difference in the thickness direction within the effective width ($R_{th,max}-R_{th,min}$) of 1,500 nm/m less, more specifically 1,000 nm/m or less, and the change in the phase difference in the thickness direction with respect to the width change within the effective width ($|\Delta R_{th}|/|\Delta x|$) of less than 1.5 nm/mm. The width change refers to the distance between given points along the x-axis ($\Delta x = x_2 - x_1$) and the phase difference in the thickness direction refers to the phase difference in the thickness direction at the between given points ($\Delta R_{th} = R_{th,2} - R_{th,1}$).

In addition to satisfying the in-plane phase difference ($R_o$) and phase difference in the thickness direction ($R_{th}$) conditions described above, the protective film may have the ratio ($R_{th}/R_o$) of the phase difference in the thickness direction ($R_{th}$) with respect to the in-plane phase difference ($R_o$) at the width center of 30 or larger, specifically 50 or larger, more specifically 60 or larger. Because it is easier to prevent the occurrence of rainbow stains as the in-plane phase difference ($R_o$) is smaller and the phase difference in the thickness direction ($R_{th}$) is larger, it is desired to maintain the ratio of the two values ($R_{th}/R_o$) large.

The present invention provides the protective film which has improved optical property while maintaining the superior mechanical property of PET to be applicable to a polarizing plate used in various applications. Hereunder is given a detailed description.

Specifically, the protective film may have a degree of crystallization of 35-55%. If the degree of crystallization is less than 35%, mechanical property such as tensile strength, etc. may be unsatisfactory. And, if it exceeds 55%, the protective film may break easily due to excessive degree of crystallization.

The degree of crystallization ($X_c$) is calculated by Equation 1.

$$X_c[\%]=d_c(d-d_a)/d(d_c-d_a)*100 \qquad \text{[Equation 1]}$$

$X_c$: degree of crystallization, $d_c$: density (g/cm$^3$) of crystalline region, $d_a$: density (g/cm$^3$) of amorphous region, d: density (g/cm$^3$) at measured site In an exemplary embodiment, $d_c$ and $d_a$ are calculated as 1.455 g/cm$^3$ and 1.335 g/cm$^3$, respectively.

Specifically, the protective film may have a pencil hardness of 5B or greater. If the pencil hardness is 6B or lower, it may be difficult to protect a polarizer from external force. In an exemplary embodiment, the protective film may further include a hard coating layer on the polarizer. The polarizer further including the hard coating layer may have a pencil hardness of 1H or greater.

The protective film may have a tensile modulus at high temperature (85° C.) of 3.0 GPa or greater, more specifically 3.5 GPa or greater.

The protective film is heat-treated after it is introduced to a polarizing plate. If the tensile modulus of the protective film at high temperature (85° C.) is 3.0 GPa or greater, the polarizing plate may be prevented from curling.

Specifically, the polyvinyl alcohol (PVA) used as the polarizer, it curls easily during the heat treatment because of high shrinkage. If this is not prevented, wave patterns may occur on the protective film and visibility may be impaired significantly due to glittering. Because the protective film has a high tensile modulus at high temperature (85° C.), the curling of the polyvinyl alcohol (PVA) can be prevented and, therefore, the wave patterns, glittering, separation of the polarizer from the protective film, cracking, etc. can be prevented in advance.

In the present invention, the protective film may be formed as follows.

The protective film may be formed by stretching an unstretched sheet formed of PET 2.8-3.5 times in the length direction (MD) and 2.9-3.7 times in the width direction (TD).

The protective film may have similar stretching ratios in the length direction (MD) and in the width direction (TD). Therefore, the ratio (MD/TD) of the stretching ratio in the length direction (MD) to the stretching ratio in the width direction (TD) may be 0.9-1.1.

And, the protective film may be formed by stretching in the length direction (MD) and in the width direction (TD) at a stretching speed of 6.5-8.5 m/min, although not being limited thereto.

The protective film may be preheated to a predetermined temperature before stretching in the length direction (MD) and in the width direction (TD). Specifically, the preheating temperature may be in the range from $T_g$+5° C. to $T_g$+50° C. Although stretchability is good as the $T_g$ is lower, fracture may occur. Therefore, the stretching may be performed after preheating to about 78° C.

The protective film formed by stretching under the above condition may have a thickness of 40-60 μm. Also, the protective film may be fixed through heat treatment after the stretching is completed. The heat treatment may be performed at 160-230° C.

The polarizing plate according to an exemplary embodiment may be applied for a display device such as a liquid crystal display, an organic electroluminescence display, etc.

The display device includes a display panel and the polarizing plate which is disposed on at least one of the upper side and the lower side of a display panel.

Figure 3:
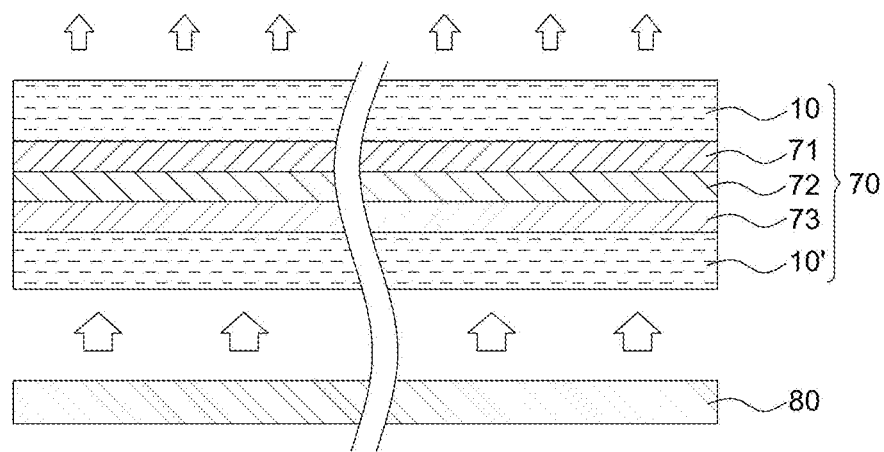
FIG. 3 schematically shows a liquid crystal display as an exemplary display panel equipped with a polarizing plate according to an exemplary embodiment.

FIG. 3 schematically shows a liquid crystal display as an exemplary display panel equipped with a polarizing plate according to an exemplary embodiment.

The liquid crystal display includes a liquid crystal panel 70 and a backlight unit 80.

The backlight unit 80 emits light to the liquid crystal panel 70. The liquid crystal panel 70 displays images using the light incident from the backlight unit.

The liquid crystal panel 70 includes an upper polarizing plate 10, a color filter substrate 71, a liquid crystal layer 72, a TFT substrate 73 and a lower polarizing plate 10'.

The TFT substrate 73 and the color filter substrate 71 face each other.

The TFT substrate 73 may include a plurality of electrodes corresponding to respective pixels, a thin-film transistor connected to the electrodes, a plurality of gate wirings applying driving signals to the thin-film transistor and a plurality of data wirings applying data signals to the electrodes through the thin-film transistor.

The color filter substrate 71 includes a plurality of color filter corresponding to respective pixels. The color filter creates red, green and blue colors by filtering incident light. The color filter substrate may include a common electrode facing the electrodes.

The liquid crystal layer 72 is interposed between the TFT substrate and the color filter substrate. The liquid crystal layer may be driven by the TFT substrate. More specifically, the liquid crystal layer may be driven by an electric field formed between the electrodes and the common electrode. The liquid crystal layer may control the polarization direction of the light passing through the polarizing plate therebelow. That is to say, the TFT substrate may control the potential difference applied between the electrodes and the common electrode in pixel units. Accordingly, the liquid crystal layer may be driven to have different optical properties in pixel units.

The upper polarizing plate 10 is disposed on the color filter substrate 71. The upper polarizing plate 10 may be adhered to the upper side of the color filter substrate 71.

The lower polarizing plate 10' is disposed below the TFT substrate 73. The lower polarizing plate 10' may be adhered to the lower side of the TFT substrate 73.

The polarization directions of the upper polarizing plate 10 and the lower polarizing plate 10' may be identical or perpendicular to each other.

Figure 4:
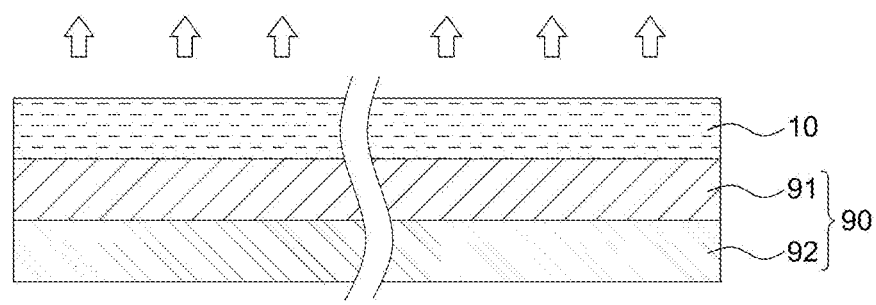
FIG. 4 schematically shows an organic electroluminescence display as an exemplary display panel equipped with a polarizing plate according to an exemplary embodiment.

FIG. 4 schematically shows an organic electroluminescence display as an exemplary display panel equipped with a polarizing plate according to an exemplary embodiment.

The organic electroluminescence display includes a front polarizing plate 10 and an organic EL panel 90.

The front polarizing plate 10 may be disposed on the front side of the organic EL panel 90. More specifically, the front polarizing plate may be attached the side of the organic EL panel on which images are displayed. The front polarizing plate may have substantially the same constitution as the polarizing plate descried above.

The organic EL panel displays images through luminescence by the pixel units. The organic EL panel includes an organic EL substrate 91 and a driving substrate 92.

The organic EL substrate 91 includes a plurality of organic electroluminescence units corresponding to respective pixels. Each of the organic electroluminescence units includes a cathode, an electron transport layer, a luminescence layer, a hole transport layer and an anode. Detailed description of the cathode, etc. will be omitted.

The driving substrate 92 is drivably coupled to the organic EL substrate 31. That is to say, the driving substrate may be coupled to the organic EL substrate so as to apply driving signals such as driving current, etc. More specifically, the driving substrate may drive the organic EL substrate by applying current to the respective organic electroluminescence units.

EXAMPLES

The present invention will be described in more detail through examples. The following examples are for illustrative purposes only and it will be apparent to those skilled in the art that the scope of this invention is not limited by the examples.

Examples 1-3 and Comparative Examples 1-4

A polyethylene terephthalate (PET) resin (SKC) was used as a material of a protective film. An unstretched sheet was prepared by extruding the PET resin at about 280° C. using an extruder and casting at about 30° C. using a casting roll.

After preheating, the unstretched sheet was stretched at 125° C. in the length direction (MD) and the width direction (TD) with the stretching ratio described in Table 1. Then, a protective film was prepared by heat setting the stretched sheet at the temperature described in Table 1 for about 30 seconds.

TABLE 1

|  | Thickness [μm] | MD stretching ratio | TD stretching ratio | MD stretching ratio/TD stretching ratio | Preheating temperature [° C.] | Heat setting temperature [° C.] |
| --- | --- | --- | --- | --- | --- | --- |
| Example 1 | 40 | 3.3 times | 3.5 times | 0.94 | 78 | 180 |
| Example 2 | 40 | 3.1 times | 3.4 times | 0.91 | 78 | 230 |
| Example 3 | 50 | 3.1 times | 3.4 times | 0.91 | 78 | 230 |
| Comparative Example 1 | 30 | 3.1 times | 3.4 times | 0.91 | 78 | 230 |
| Comparative Example 2 | 50 | 3.2 times | 4.2 times | 0.76 | 78 | 230 |
| Comparative Example 3 | 80 | 1.2 times | 4.3 times | 0.28 | 78 | 210 |
| Comparative Example 4 | 40 | 3.2 times | 3.6 times | 0.89 | 78 | 230 |

Measurement Example

The in-plane phase difference ($R_o$), phase difference in the thickness direction ($R_{th}$), in-plane phase difference within the effective width ($R_{o,max}-R_{o,min}$) and phase difference in the thickness direction within the effective width ($R_{th,max}-R_{th,min}$) of the protective films prepared in the examples and comparative examples were measured. The result is given in Table 2.

The in-plane phase difference ($R_o$) and the phase difference in the thickness direction ($R_{th}$) were measured as follows.

After determining the orientation axis of the protective film using two sheets of the polarizing plate, a sample for measurement was prepared by cutting to a size of 10 cm×10 cm perpendicularly to the orientation axis. The in-plane phase difference and the phase difference in the thickness direction were measured using a phase difference meter (Axometrics, Axoscan, measured at 550 nm). The refractive index of the protective film (sample) was measured using an Abbe refractometer (Atago, NAR-4T, measured at 546 nm) and the thickness d (μm) of the protective film was measured using an electronic micrometer (Fineloop, Millitron 1245D).

The in-plane phase difference ($R_o$) and the phase difference in the thickness direction ($R_{th}$) were measured for the protective film of Example 1 over the entire effective width. The result is shown in FIGS. 5A-5C and FIGS. 6A-6C.

TABLE 2

|  | $R_o$[1] [nm] | $R_{th}$[2] [nm] | $R_{th}/R_o$[3] [nm] | Variation of $R_o$ within effective width[4] [nm/m] |
| --- | --- | --- | --- | --- |
| Example 1 | 98 | 6,850 | 69.9 | 250 |
| Example 2 | 170 | 6,100 | 35.9 | 320 |
| Example 3 | 160 | 8,200 | 51.3 | 460 |
| Comparative Example 1 | 130 | 5,700 | 43.8 | 270 |
| Comparative Example 2 | 1900 | 10,400 | 5.47 | 420 |
| Comparative Example 3 | 8100 | 7,100 | 0.88 | 100 |
| Comparative Example 4 | 305 | 5,500 | 18.0 | 410 |

[1] In-plane phase difference ($R_o$) at width center
[2] Phase difference in thickness direction ($R_{th}$) at width center
[3] Ratio of phase difference in thickness direction ($R_{th}$) with respect to in-plane phase difference ($R_o$) at width center
[4] Effective width: ±1,500 mm from width center (about 3,000 mm)

Figure 5A:
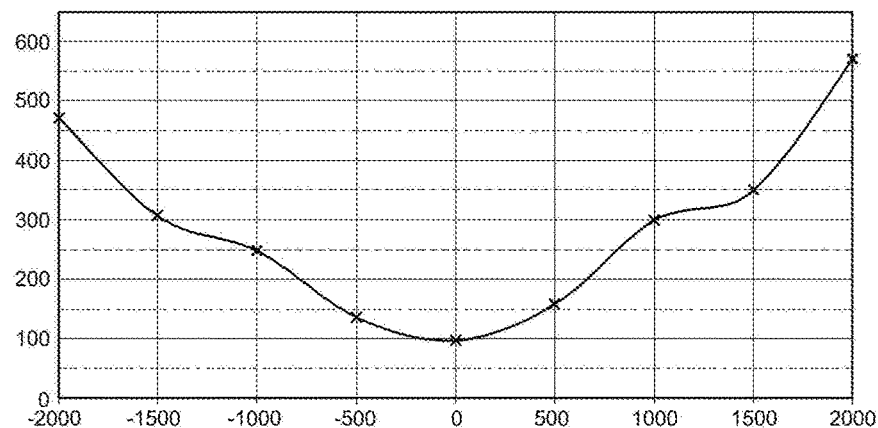
FIGS. 5A, 5B, and 5C show a result of measuring in-plane phase difference ($R_o$) for the entire effective width of a protective film of Example 1.
Figure 5B:
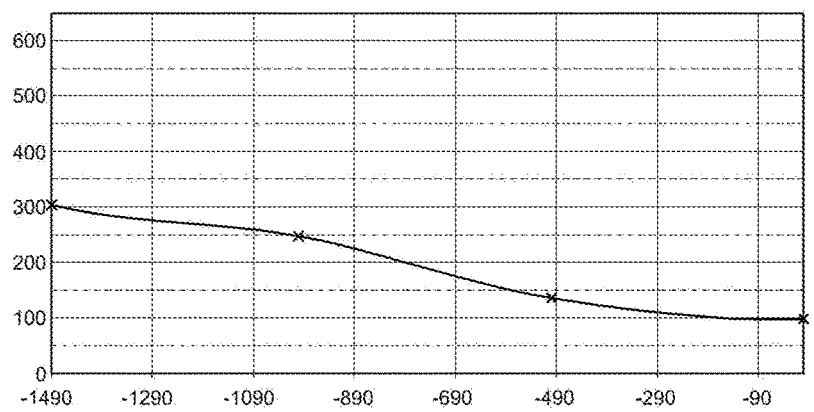
Figure 5C:
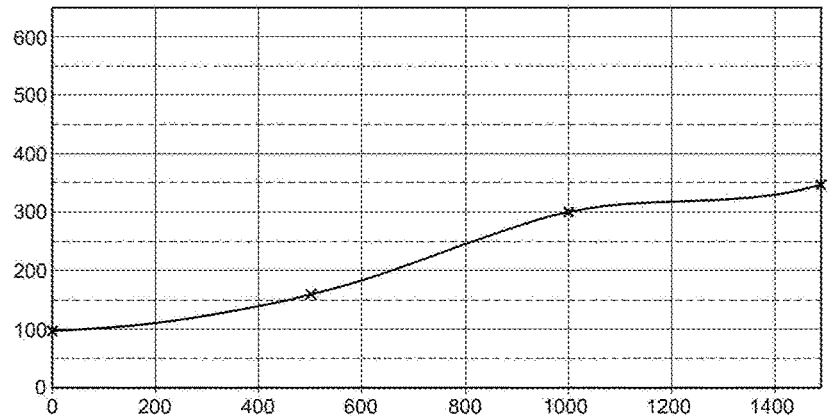

Referring to FIGS. 5A-5C, it can be seen that the protective film of Example 1 satisfies the following conditions.

In-plane phase difference ($R_o$) at the width center ≤100 nm

Figure 6A:
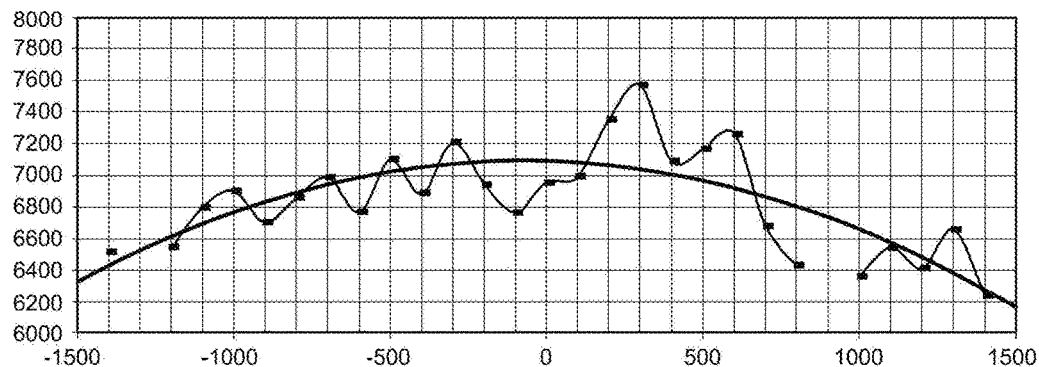
FIGS. 6A, 6B, and 6C show a result of measuring phase difference in the thickness direction ($R_{th}$) for the entire effective width of a protective film of Example 1.
Figure 6B:
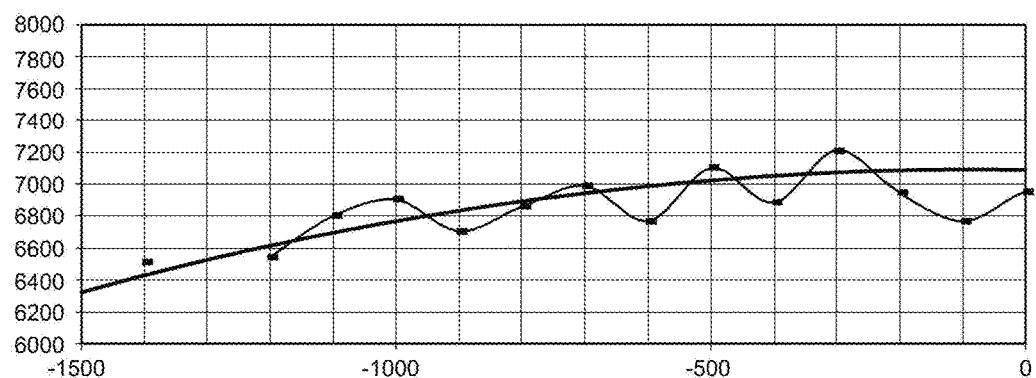
Figure 6C:
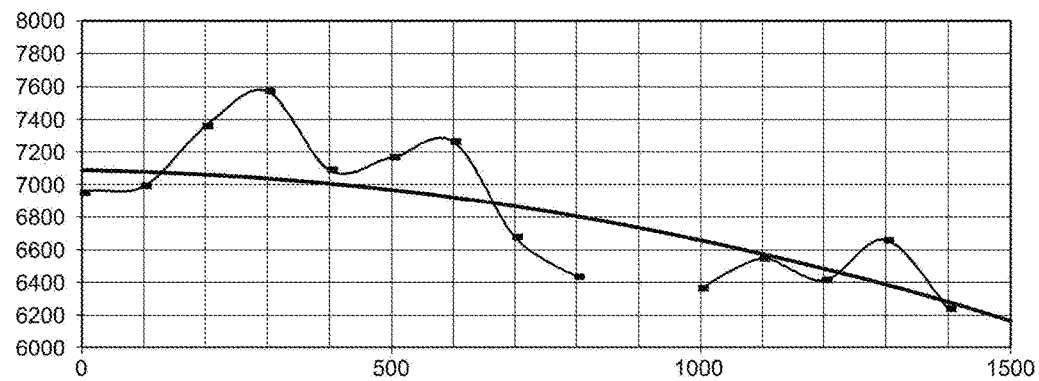

In-plane phase difference ($R_o$) within ±500 mm from the width center in the width direction ≤160 nm In-plane phase difference ($R_o$) within ±1000 mm from the width center in the width direction ≤300 nm Change in the in-plane phase difference with respect to the width change ($|\Delta R_o|/|\Delta x|$) within the effective width <5 nm/cm Referring to FIGS. 6A-6C, it can be seen that the protective film of Example 1 satisfies the following conditions.

Phase difference in the thickness direction ($R_{th}$) at the width center≥6,800 nm Change in the phase difference in the thickness direction with respect to the width change ($|\Delta R_{th}|/|\Delta x|$) within the effective width <1.5 nm/mm Test Example The appearance after application to a display device, degree of crystallization, density, pencil hardness, pencil hardness after hard coating and tensile modulus at high temperature of the protective films of the examples and comparative examples were evaluated. The result is given in Table 3 and Table 4.

The appearance was evaluated as follows.

The protective films of the examples and comparative examples were introduced to a polarizing plate with a structure shown in FIG. 1. Then, a hard coating layer was formed on the protective film. After applying the resulting polarizing plate to a TV or a monitor, it was visually evaluated whether rainbow stains or coloring from the front and oblique directions of the polarizing plate.

⊙: No rainbow stain or coloring is observed from any direction.

○: No rainbow stain is observed from any direction but very slight coloring is observed from an oblique direction.

Δ: Slight rainbow stains and coloring are observed from an oblique direction.

X: Clear rainbow stains and are observed from an oblique direction.

The degree of crystallization of the protective film was measured by the density method described above (Equation 1).

The pencil hardness of the protective film was measured using a pencil hardness tester (Kipae E&T, KP-M5000M) and a Mitsubishi 'UNI' grade pencil. The pencil hardness was also measured after forming the hard coating layer on the protective film.

The tensile modulus of the protective film was measured using a universal testing machine (Instron, 4485 TIC960203-97B1A).

TABLE 3

|  | Appearance on TV | Appearance on monitor | Density [g/cm³] | Degree of crystallization [%] | Pencil hardness | Pencil hardness after H/C |
|---|---|---|---|---|---|---|
| Example 1 | ⊙ | ⊙ | 1.388 | 44 | 5B | 2H |
| Example 2 | ○ | ⊙ | 1.397 | 52 | 5B | 2H |
| Example 3 | ⊙ | ⊙ | 1.397 | 52 | 5B | 2H |
| Comparative Example 1 | X | ⊙ | 1.398 | 53 | 6B | 1H |
| Comparative Example 2 | X | Δ | 1.405 | 58 | 4B | 2H |
| Comparative Example 3 | ⊙ | ⊙ | 1.397 | 43 | 5B | 2H |
| Comparative Example 4 | X | ⊙ | 1.401 | 55 | 5B | 2H |

TABLE 4

|  | Tensile modulus (@ 85° C.) | | Visibility[1] | |
|---|---|---|---|---|
|  | MD [GPa] | TD [GPa] | Length direction | Width direction |
| Example 1 | 3.7 | 3.8 | ○ | ○ |
| Example 2 | 3.7 | 4.0 | ○ | ○ |
| Example 3 | 3.8 | 3.9 | ○ | ○ |
| Comparative Example 1 | 4.0 | 4.1 | X | Δ |
| Comparative Example 2 | 3.8 | 4.2 | ○ | ○ |
| Comparative Example 3 | 2.2 | 5.8 | X | ○ |
| Comparative Example 4 | 3.8 | 4.0 | ○ | ○ |

[1]Visibility was evaluated based on the occurrence of wave patterns and glittering. The evaluation standard was as follows. ○: no decrease in visibility, Δ: slight decrease in visibility, X: severe decrease in visibility.

Referring to Table 3 and Table 4, it can be seen that the protective films of Examples 1-3 can be used for various applications because they showed good degree of crystallization, pencil hardness and tensile modulus while having superior optical property with no rainbow stain or coloring.

In particular, it can be seen that the protective film of Example 1 showed well-balanced optical property and mechanical property and, thus, is the most suitable for application to a polarizing plate for a display device.

The present invention has been described in detail with reference to specific embodiments thereof. However, it will be appreciated by those skilled in the art that various changes and modifications may be made in these embodiments without departing from the principles and spirit of the invention, the scope of which is defined in the appended claims and their equivalents.

The polarizing plate having the protective film for a polarizer according to an exemplary embodiment is applicable to various display devices such as a liquid crystal display, an organic electroluminescence display, etc.

What is claimed is:

1. A protective film for a polarizer, the protective film comprising polyethylene terephthalate (PET), wherein the protective film satisfies the in-plane phase difference and phase difference in the thickness direction conditions of (1) and (2) at a wavelength of 550 nm:

(1) 10 nm ≤ in-plane phase difference ($R_o$) ≤ 350 nm (2) 16,000 nm ≥ phase difference in thickness direction ($R_{th}$) ≥ 6,000 nm, the protective film experiences change in the in-plane phase difference with respect to the width change within the effective width ($|\Delta R_o|/|\Delta x|$) of less than 5 nm/cm, the protective film experiences variation in the in-plane phase difference within the effective width ($R_{o,max} - R_{o,min}$) of 250 nm/m or less, and the protective film has a degree of crystallization ($X_c$) of 35-55%.

2. The protective film for a polarizer according to claim 1, which has an in-plane phase difference ($R_o$) at the width center of 200 nm or less.

3. The protective film for a polarizer according to claim 1, which has an in-plane phase difference ($R_o$) within ±500 mm from the width center along the width direction of 250 nm or less.

4. The protective film for a polarizer according to claim 1, which has an in-plane phase difference ($R_o$) within ±1000 mm from the width center along the width direction of 300 nm or less.

5. The protective film for a polarizer according to claim 1, which has a ratio ($R_{th}/R_o$) of the phase difference in the thickness direction ($R_{th}$) with respect to the in-plane phase difference ($R_o$) at the width center of 60 or larger and 1,600 or smaller.

6. The protective film for a polarizer according to claim 1, which has a stretching ratio in the length direction (MD) of 2.8-3.5 times and a stretching ratio in the width direction (TD) of 2.9-3.7 times.

7. The protective film for a polarizer according to claim 1, which has a ratio (MD/TD) of a stretching ratio in the length direction (MD) with respect to a stretching ratio in the width direction (TD) of 0.9-1.1.

8. The protective film for a polarizer according to claim 1, which has a thickness of 20-60 μm.

9. The protective film for a polarizer according to claim 1, which is stretched in the length direction and the width direction and then heat-treated at 160-230° C.

10. A polarizing plate comprising:
a polarizer; and
the protective film for a polarizer according to claim 1, the protective film being adjacent to at least one of the upper side and the lower side of the polarizer.

11. A display device comprising:
a display panel; and
the polarizing plate according to claim 10, the polarizing plate being disposed on at least one of the upper side and the lower side of the display panel.

12. The protective film for a polarizer according to claim 1, wherein the degree of crystallization ($X_c$) is calculated by:

$$X_c[\%]=d_c(d-d_a)/d(d_c-d_a)*100$$

where $d_c$ is density (g/cm$^3$) of crystalline region, $d_a$ is density (g/cm$^3$) of amorphous region, and d is density (g/cm$^3$) at measured site.

13. The protective film for a polarizer according to claim 12, wherein $d_c$ is about 1.455 g/cm$^3$ and $d_a$ is about 1.335 g/cm$^3$.

14. A polarizing plate comprising:
a polarizer;
a first protective film for a polarizer according to claim 1, the first protective film being adjacent to the upper side of the polarizer; and
a second protective film for a polarizer according to claim 1, the second protective film being adjacent to the lower side of the polarizer.

15. A display device comprising:
a display panel;
a first polarizing plate according to claim 14, the first polarizing plate being disposed on the upper side of the display panel; and
a second polarizing plate according to claim 14, the second polarizing plate being disposed on the lower side of the display panel.

16. A display device comprising:
a display panel; and
the polarizing plate according to claim 14, the polarizing plate being disposed on at least one of the upper side and the lower side of the display panel.

* * * * *